(12) United States Patent
Ko et al.

(10) Patent No.: US 12,034,407 B2
(45) Date of Patent: Jul. 9, 2024

(54) UP/DOWN FREQUENCY CONVERTER WITH MILLIMETER-WAVE LOW-PHASE-NOISE LOCAL OSCILLATOR

(71) Applicant: Samsung Electronics Co., Ltd., Gyeonggi-do (KR)

(72) Inventors: Jaeyong Ko, Gyeonggi-do (KR); Namkyoung Kim, Gyeonggi-do (KR); Chanwook An, Gyeonggi-do (KR); Kyungho Yoo, Gyeonggi-do (KR); Tongho Chung, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 17/970,256

(22) Filed: Oct. 20, 2022

(65) Prior Publication Data

US 2023/0043914 A1    Feb. 9, 2023

Related U.S. Application Data

(63) Continuation of application No. PCT/KR2022/007473, filed on May 26, 2022.

(30) Foreign Application Priority Data

Jun. 28, 2021 (KR) .......... 10-2021-0083677
Oct. 19, 2021 (KR) .......... 10-2021-0139254

(51) Int. Cl.
*H03D 7/14* (2006.01)
*H04B 1/00* (2006.01)
*H04B 1/04* (2006.01)

(52) U.S. Cl.
CPC ......... *H03D 7/1466* (2013.01); *H03D 7/1441* (2013.01); *H04B 1/0096* (2013.01); *H04B 2001/0416* (2013.01)

(58) Field of Classification Search
CPC ...... H03D 7/14; H03D 7/1425; H03D 7/1466; H03D 7/16; H03D 7/161; H03D 7/163;
(Continued)

(56) References Cited

U.S. PATENT DOCUMENTS 5,924,021 A   7/1999   Paul et al.
7,701,299 B2  4/2010   Chenakin
(Continued)

FOREIGN PATENT DOCUMENTS

| KR | 1020110071843 | 6/2011 |
| KR | 102152131 | 9/2020 |
| WO | WO 2009/083949 | 7/2009 |

OTHER PUBLICATIONS

ThinkRF DS 74-0102 D4000 RF Downconverter, Preliminary Product Brochure and Technical Datasheet, 2020, 5 pages.
(Continued)

*Primary Examiner* — Long Nguyen
(74) *Attorney, Agent, or Firm* — The Farrell Law Firm, P.C.

(57) ABSTRACT

An electronic device for converting a frequency with a local oscillator (LO) for generating an LO signal is provided. The electronic device may include an intermediate frequency (IF) port configured to input or output a signal in a first frequency band, a radio frequency (RF) port configured to input or output a signal in a second frequency band, a passive mixer configured to convert the signal in the first frequency band into the signal in the second frequency band or convert the signal in the second frequency band into the
(Continued)

signal in the first frequency band, an LO configured to generate an LO signal in one of a plurality of frequency bands and provide the LO signal to the passive mixer, and a bi-directional amplifier including a gain equalizer configured to control gain flatness of a signal input to or output from the IF port.

14 Claims, 7 Drawing Sheets

(58) Field of Classification Search
CPC ........ H03D 7/165; H04B 1/0096; H04B 1/40; H04B 1/44; H04B 2001/0416; H03L 7/02; H03L 7/16
See application file for complete search history.

(56) References Cited

U.S. PATENT DOCUMENTS

| | | | |
|---|---|---|---|
| 10,193,497 | B2 | 1/2019 | Yu et al. |
| 10,374,788 | B2 | 8/2019 | Leipold et al. |
| 11,558,128 | B2 * | 1/2023 | Pyo ................ H04B 17/103 |
| 2006/0057996 | A1 | 3/2006 | Petrovic et al. |
| 2006/0192672 | A1 | 8/2006 | Gidge et al. |
| 2006/0258311 | A1 | 11/2006 | Pestryakov et al. |
| 2010/0173593 | A1 | 7/2010 | Magne |
| 2015/0303929 | A1 | 10/2015 | Hamdane et al. |

OTHER PUBLICATIONS

D-383_UPB-W-29.75-1.2, Multiple Wideband Ku and Ka Upconverters, Oct. 3, 2017, 6 pages.
D-382-DNB3-2_29.5-1.5, Multiple Output Wideband Ku and Ka Downconverters, Aug. 30, 2017, 6 pages.
Cross Technologies Inc., 4116-275 Ka-Band Block Downconverter, Weather Resistant, Data Sheet, Apr. 30, 2012, 1 page.
Cross Technologies Inc., 4115-300 Ka-Band Block Downconverter, Weather Resistant, Data Sheet, Nov. 16, 2015, 1 page.
Cross Technologies Inc., 4115-267 Ka-Band Block Downconverter, Weather Resistant, Data Sheet, Dec. 7, 2010, 1 page.
Cross Technologies Inc., 3116-41-310 Ka-Band Block Downconverter, Weather Resistant, Data Sheet, Oct. 18, 2013, 1 page.
National Instruments, "QuickSyn Lite mmW Synthesizer Modules", FSL mmW Series, Feb. 2021, 19 pages.
RF-Lambda 'RF Hopping Synthesizer, RSYN01G44GA, Sep. 15, 2022, 14 pages.
SignalCore: '40 GHz CW Signal Generators (Signal Sources), Datasheet, SC5520A & SC5521A UHFS, Oct. 9, 2020, 12 pages.
Work Microwave: 'Satellite Up- and Downconverter', Indoor/Outdoor, Jun. 26, 2019, 8 pages.
ThinkRF: 'D4000 RF Downconverter/Tuner', Product Brochure and Technical Datasheet, 2020, 7 pages.
J. Ko et al., "A 5G Millimeter-Wave Up/Down Converter for Cost Effective RF Measurements", 2021, 3 pages.
International Search Report dated Aug. 31, 2022 issued in counterpart application No. PCT/KR2022/007473, 3 pages.

* cited by examiner

UP/DOWN FREQUENCY CONVERTER WITH MILLIMETER-WAVE LOW-PHASE-NOISE LOCAL OSCILLATOR

CROSS-REFERENCE TO RELATED APPLICATIONS

This application is a Bypass Continuation Applications of International Application No. PCT/KR2022/007473, designating the United States, filed on May 26, 2022, and is based on and claims priority to Korean Patent Application Nos. 10-2021-0083677 and 10-2021-0139254, which were filed in the Korean Intellectual Property Office on Jun. 28, 2021, and Oct. 19, 2021, respectively, the disclosures of each of which are incorporated herein by reference in their entireties.

BACKGROUND

1. Field

The following disclosure relates to an electronic device for converting a frequency upward and downward with a millimeter-wave low-phase-noise local oscillator.

2. Description of Related Art

With the increase in the demand for millimeter-wave (mmWave) frequencies having a wider signal bandwidth due to today's communication standards, such as fifth generation new radio (5G NR), additional expensive test equipment may be required to meet the current wireless standards.

SUMMARY

According to various embodiments, by converting a mmWave band signal (e.g., 24.25 gigahertz (GHz) to 43.5 GHz) into a sub-6G band signal (e.g., 0.6 GHz to 6 GHz), a millimeter-wave band signal may be effectively generated and analyzed by the previously developed test equipment for a sub-6G band without any additional newly developed test equipment.

According to an embodiment, an electronic device may include an intermediate frequency (IF) port configured to input or output a signal in a first frequency band, a radio frequency (RF) port configured to input or output a signal in a second frequency band higher than the signal in the first frequency band, a passive mixer configured to convert the signal in the first frequency band into the signal in the second frequency band or convert the signal in the second frequency band into the signal in the first frequency band, a local oscillator (LO) configured to generate an LO signal in one of a plurality of frequency bands based on a phase locked loop (PLL) including a third-order passive filter and provide the LO signal to the passive mixer, and a bi-directional amplifier arranged between the IF port and the passive mixer and including a gain equalizer configured to control gain flatness of a signal input to or output from the IF port.

According to an embodiment, a local oscillator may include a 20 GHz PLL including a third-order passive filter, and a switch configured to transmit a signal received from the PLL to one of a plurality of paths, wherein an LO signal in one of a plurality of frequency bands may be generated and output by one of the plurality of paths.

According to various embodiments, if a RF signal is converted into an IF signal and the converted IF signal is provided to a frequency range 1 (FR1) measuring instrument, an electrical characteristic and performance test of a device dealing with an FR2 frequency band signal may be performed at a low cost without an expensive FR2 measuring instrument.

In addition, according to various embodiments, an architecture in which an RF signal is converted into an IF signal and an IF signal is converted into an RF signal based on high linearity may be used to easily implement a frequency converter dealing with an FR2 band, an RF millimeter integrated circuit (MMIC), a communication terminal, a communication repeater, a RF integrated circuit (RFIC), and a measuring instrument.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
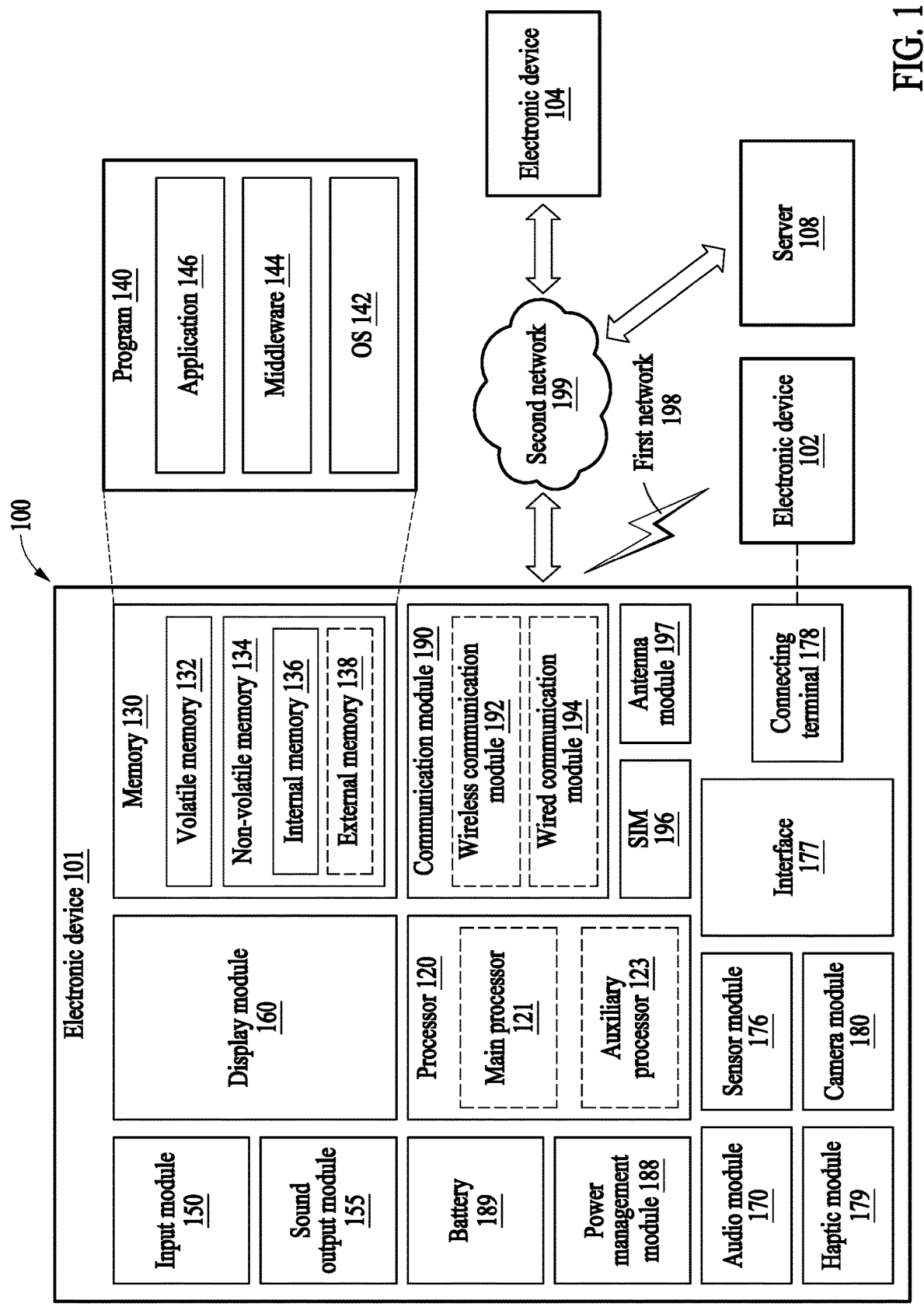
FIG. 1 is a block diagram illustrating an electronic device in a network environment according to an embodiment.

Hereinafter, embodiments will be described in detail with reference to the accompanying drawings. When describing the embodiments with reference to the accompanying drawings, like reference numerals refer to like elements and any repeated description related thereto will be omitted.

FIG. 1 is a block diagram illustrating an electronic device in a network environment according to an embodiment.

Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). The electronic device 101 may communicate with the electronic device 104 via the server 108. The electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, and/or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. As at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). The auxiliary processor 123 (e.g., an ISP or a CP) may be implemented as a portion of another component (e.g., the camera module 180 or the communication module 190) that is functionally related to the auxiliary processor 123. The auxiliary processor 123 (e.g., an NPU) may include a hardware structure specified for artificial intelligence model processing. An artificial intelligence model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent DNN (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. The receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. The display module 160 may include a touch sensor adapted to detect a touch, or a pressure sensor adapted to measure the intensity of force incurred by the touch.

The audio module 170 may convert a sound into an electric signal or vice versa. The audio module 170 may obtain the sound via the input module 150 or output the sound via the sound output module 155 or an external electronic device (e.g., the electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). The connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. The haptic module 179 may include, for example, a motor, a piezoelectric element, and/or an electric stimulator.

The camera module 180 may capture a still image and moving images. The camera module 180 may include one or more lenses, image sensors, image signal processors, and/or flashes.

The power management module 188 may manage power supplied to the electronic device 101. The power management module 188 may be implemented as, for example, at least a part of a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. The communication module 190 may include a wireless communication module 192 (e.g., a cellular communication module, a short-range wireless communication module, and/or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)), or the second network 199 (e.g., a long-range communication network, such as a legacy cellular network, a 5G network, a next-generation communication network, the Internet, or a computer network (e.g., a LAN or a wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., NR access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). The wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. Another component (e.g., an RFIC) other than the radiating element may be additionally formed as a part of the antenna module 197.

The antenna module 197 may form a mmWave antenna module. The mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the external electronic devices 102 or 104 may be a device of the same type as or a different type from the electronic device 101.

All or some of operations to be executed by the electronic device 101 may be executed at one or more external electronic devices (e.g., the external devices 102 and 104, and the server 108). For example, if the electronic device 101 needs to perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an example embodiment, the external electronic device 104 may include an Internet-of-things (IoT) device. The server 108 may be an intelligent server using machine learning and/or a neural network. The external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic device may include, for example, a portable communication device (e.g., a smartphone), a computer device, a portable multimedia device, a portable medical device, a camera, a wearable device, or a home appliance device, although the electronic device is not limited to those described above.

It should be understood that the various embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with the various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., the internal memory 136 or the external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
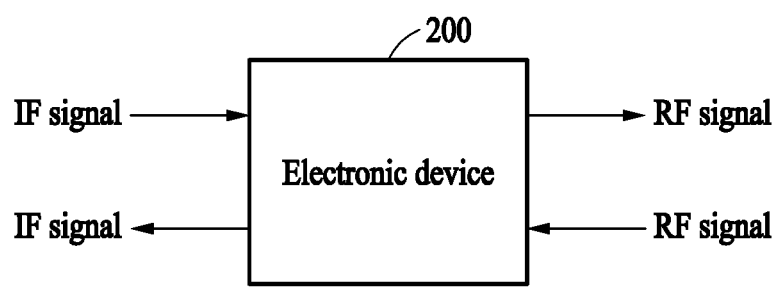
FIG. 2 is a diagram illustrating an operation of an electronic device performing frequency conversion according to an embodiment.

FIG. 2 is a diagram illustrating an operation of an electronic device performing frequency conversion according to an embodiment.

Referring to FIG. 2, an electronic device 200 may convert an IF signal into a RF signal or convert an RF signal into an IF signal.

An IF signal may be a signal in a frequency range 1 (FR1) band of 5G NR, for example, an IF signal having a frequency band of 1 GHz to 5 GHz. An RF signal may be a mmWave signal or a signal in a frequency range 2 (FR2) band of 5G NR, for example, an RF signal having a frequency band of 21 GHz to 45 GHz.

The electronic device 200 may be a device for performing direct conversion between the IF signal and the RF signal, the device having high linearity to deal with high-order modulation signals with an RF input/output wide-band characteristic to cover an entire band of the RF signal. To this end, the electronic device 200 may include a wide-band passive mixer, a bi-directional IF amplifier with high linearity, and a low-phase-noise LO, which will be described in detail with reference to the following drawings.

For example, in order to test an electrical characteristic and performance of a device dealing with the signal in the FR2 band, an FR2 measuring instrument supporting the FR2 band is required, but the FR2 measuring instrument may be more expensive than an FR1 measuring instrument supporting the FR1 band. Thus, if the RF signal is converted into the IF signal through the electronic device 200 and the IF signal is provided to the FR1 measuring instrument, the electrical characteristic and performance test of the device dealing with an FR2 band signal may be performed at a low cost without the expensive FR2 measuring instrument. When the electronic device 200 converts the RF signal into the IF signal or converts the IF signal into the RF signal, linearity of frequency conversion may be required to minimize an information loss. If the RF signal is converted into the IF signal through frequency conversion with high linearity, the electrical characteristic and performance test of the device dealing with the FR2 band signal may be performed with high precision by using the relatively cheaper FR1 measuring instrument.

In addition, the electronic device 200 may convert the RF signal into the IF signal and also convert the IF signal into the RF signal, and through this conversion, various operations may be performed. For example, the electronic device 200 may be one of a frequency converter, an RF MMIC, a communication terminal, a communication repeater, an RFIC, and a measuring instrument. The measuring instrument may be one of a signal generator, a spectrum analyzer, and a network emulator.

Figure 3:
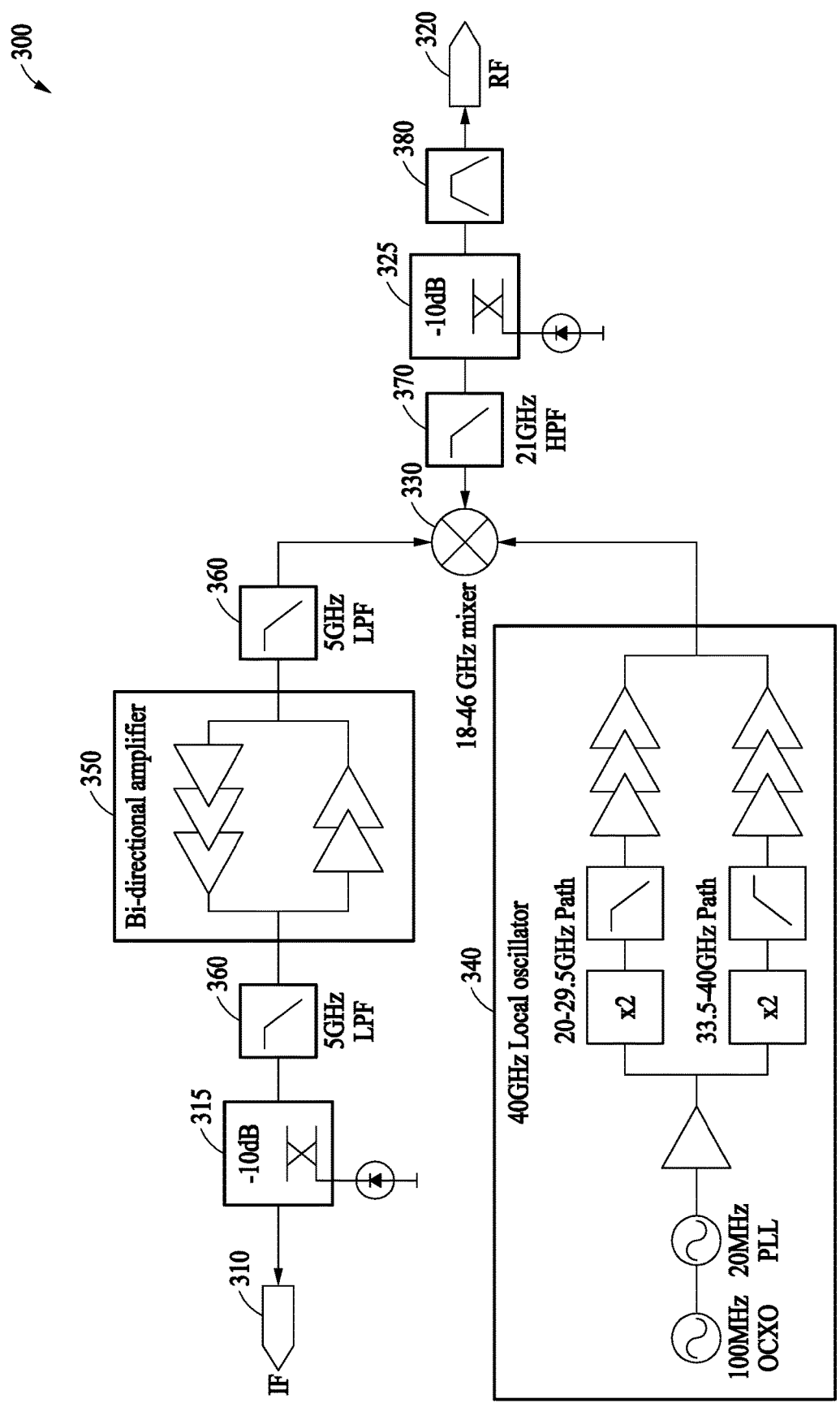
FIG. 3 illustrates a circuit diagram of an electronic device performing frequency conversion according to an embodiment.

FIG. 3 illustrates a circuit diagram of an electronic device performing frequency conversion according to an embodiment.

Referring to FIG. 3, an electronic device 300 may include an IF port 310, an RF port 320, a passive mixer 330, an LO 340, and a bi-directional amplifier 350.

The electronic device 300 may have a wide IF bandwidth of 1 GHz to 5 GHz and 21 GHz to 45 GHz through a direct conversion between an IF signal and RF signal, and the LO 340 may generate an LO signal in a band of 20 GHz to 29.5 GHz and 33.5 GHz to 40 GHz. In order to achieve high linearity of the electronic device 300, the LO 340 may need to generate a low amount of close-in phase noise and remove a high harmonic wave and/or spurious wave. In addition, the electronic device 300 may include the bi-directional amplifier 350 for bi-directional conversion and have low gain variation to maintain linearity of a wide-band modulation signal.

There may be three factors that distort linearity of the electronic device 300. A first factor may be a close-in phase noise of the LO 340, which may have a negative impact on a channel adjacent to a converted signal. A second factor may be AM/PM (amplitude-to-phase) distortion of the bi-directional amplifier 350. A third factor may be magnitude ripple/group delay distortion of a conversion gain of the passive mixer 330.

The passive mixer 330 may have a passive double-balanced structure in order to support an RF frequency band (e.g., 21 GHz to 45 GHz) and have a maximum IF and RF input (~20 decibel milliwatt (dBm)). The passive mixer 330 may use the LO signal of the LO 340 to convert an IF signal input to the IF port 310 into an RF signal and transmit the RF signal to the RF port 320 or convert an RF signal input to the RF port 320 into an IF signal and transmit the IF signal to the IF port 310.

For example, an isolation characteristic measured in accordance with power of the LO 340 may be as follows. At a 17 dBm power of the LO 340, LO leakage for both the IF port 310 and the RF port 320 is less than −35 dB, and an isolation level of RF-IF may exceed −23.02 dB and an isolation level of IF-RF may exceed −10 dB. Since a rejection loss of a low-pass filter used along an IF path may exceed −30 dB after 7 GHz, an IF out-of-band noise of 70 dB or more including LO and RF leakage may be suppressed. In addition, a high-pass filter in an RF path may have a rejection loss of −50 dB or more at less than 16 GHz to filter out IF leakage. However, an RF out-of-band-pass filter may be required to suppress an image generated in the LO leakage and an RF bandwidth even more. A measured up/down-conversion loss of the passive mixer 330 according to the power of the LO 340 may be less than −11.4/−8.7 dB at 17 dBm. Thus, a power of 17 dBm may be derived as an optimal power of the LO 340 for the passive mixer 330.

Since a 21 GHz high-pass filter 370 may be arranged between the passive mixer 330 and the RF port 320, an out-of-band noise component (e.g., an IF and LO signal leaked from the passive mixer 330, and an image component (e.g., an LO-IF component)) may be removed. In another example, a band-pass filter 380 may be additionally arranged between the passive mixer 330 and the RF port 320, and thus, the out-of-band noise component may be removed. In addition, a 10 dB coupler and a root mean square (RMS) power detector 325 may be connected to the RF port 320, and thus, a real-time RF output may be obtained during frequency up-conversion.

The LO 340 may have dual path configuration of 20 GHz to 29.5 GHz and 33.5 GHz to 40 GHz to output a wide-band LO signal, and based on the LO signal, frequency up/down-conversion in an entire 5G FR2 commercial band may be performed. The LO 340 may support a triode area operation of the passive mixer 330 by performing a high output in a 17 dBm section using a multi-stage amplifier. In addition, the LO 340 may include a 20 GHz PLL and a 45 GHz doubler to output a ~40 GHz low-phase noise and a 1-Tone (a continuous wave (CW)) signal.

The bi-directional amplifier 350 may be arranged between the IF port 310 and the passive mixer 330, amplify and transmit a signal received from the IF port 310 to the passive mixer 330 when converting an IF signal into an RF signal, and amplify and transmit a signal received from the passive mixer 330 to the IF port 310 when converting the RF signal into the IF signal. Since an active element has a low power efficiency in an FR2 band, the bi-directional amplifier 350 may construct a bi-directional path in an IF band. For example, to secure an IF path gain during bi-directional frequency conversion, in the bi-directional amplifier 350, a two-stage amplifier may be arranged in an up-conversion path, and a three-stage amplifier may be arranged in a down-conversion path, but these embodiments are not limited thereto.

A 5 GHz low-pass filter 360 may be respectively arranged before and after the bi-directional amplifier 350, and the low-pass filters 360 may remove a harmonic component generated by the multi-stage amplifier during frequency up or down-conversion and remove an image component and a LO leakage component generated by the passive mixer 330 during down-conversion.

In addition, the 10 dB coupler and an RMS detector 315 may be connected to the IF port 310, and thus, a real-time IF output may be obtained during the frequency down-conversion.

The electronic device 300 may reconstruct an operation in an up or down-conversion mode having a wide IF and RF bandwidth, thereby extending an available frequency range to multiple devices. In addition, a phase noise of the electronic device 300 may help the electronic device 300 exhibit highest performance at a higher carrier wave frequency to minimize error vector magnitude (EVM) distortion and easily convert a wide-band modulation signal.

Figure 4:
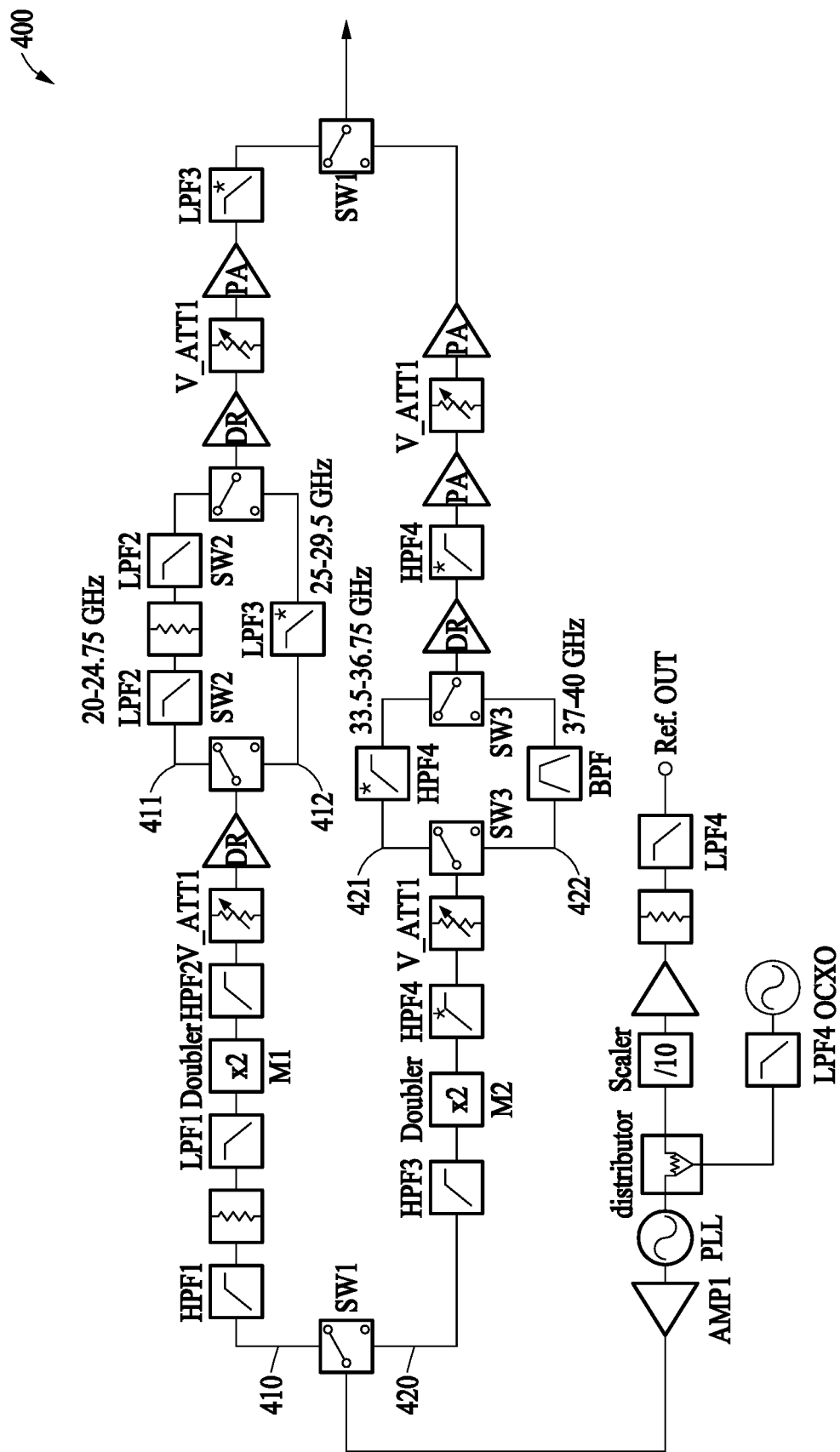
FIGS. 4 and 5 illustrate operations of a local oscillator according to an embodiment.
Figure 5:
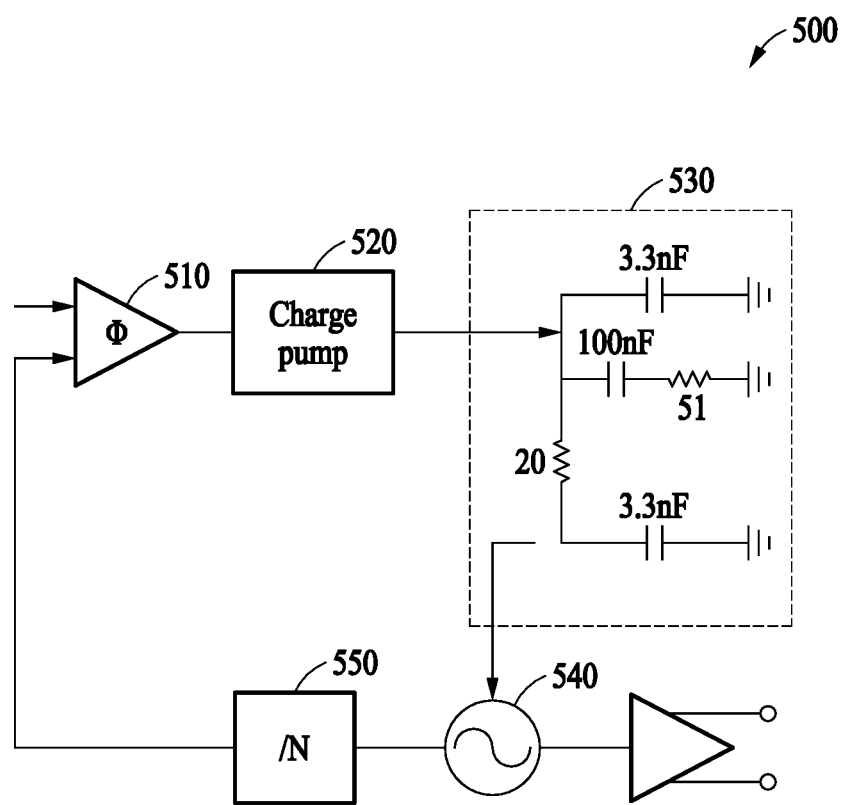

FIGS. 4 and 5 illustrates operations of an LO according to an embodiment.

Referring to FIG. 4, a circuit diagram of an LO 400 is illustrated.

The LO 400 may generate an LO signal in one of a plurality of frequency bands based on a PLL including a third-order passive filter and provide the LO signal to the passive mixer 330.

An oven-controlled crystal oscillator (OCXO) may be an oscillator having a high precision characteristic of a frequency for the LO signal generated by the LO 400 and a low aging characteristic for precision and long-term use and generate a 100 megahertz (MHz) signal.

A fourth low-pass filter (LPF4) may remove a noise component included in the 100 MHz signal generated by the OCXO and transmit the signal to a distributor, and the distributor may distribute the received signal to a PLL and a scaler. The signal transmitted to the scaler may have a frequency decreased to 1/10 to be output as a reference-out through an amplifier, a resistor, and a fourth low-pass filter. A 10 MHz reference-out (e.g., 0 dBm) may be used for synchronization of another measuring instrument.

The PLL may generate a signal with a constant frequency (e.g., 20 GHz) based on the 100 MHz signal received from the distributor. Referring to FIG. 5, a PLL 500 may include a phase comparator 510, a charge pump 520, a third-order passive filter 530, a voltage controlled oscillator (VCO) 540, and a scaler 550.

The phase comparator 510 may output a pulse based on a phase difference between a 100 MHz signal received from the distributor and a feedback signal distributed from the VCO 540. The pulse output from the phase comparator 510 may be transmitted to the charge pump 520 and converted into a voltage. The voltage output from the charge pump 520 may be applied to the third-order passive filter 530.

The third-order passive filter 530 may include a 3.3 noise figure (nF) capacitor, a 100 nF capacitor, a 51 ohm resistor, a 20 ohm resistor, and a 3.3 nF capacitor. Values of elements included in the third-order passive filter 530 may be determined by optimizing a phase noise at 1 MHz to 100 MHz of an offset frequency point corresponding to 10 GHz to 20 GHz of output. Due to a characteristic of a 5G NR modulation signal with a wide signal bandwidth (e.g., 400 MHz or more), a phase noise characteristic at an offset frequency point after 1 MHz may be an important factor in linear distortion of a modulation signal to be converted.

The voltage passing through the third-order passive filter 530 may be transmitted to the VCO 540, an oscillation signal may be generated by the VCO 540, and accordingly, a frequency of the oscillation signal may be decreased to 1/N (e.g., 1/200) by the scaler 550 and fed back to the phase comparator 510. Through this process, the VCO 540 may output a signal having a constant frequency of 20 GHz.

Referring back to FIG. 4, a 20 GHz signal output from the PLL may be amplified by an amplifier AMP1 and transmitted to a switch SW1, and switch SW1 may transmit the received signal to one of a first path 410 and a second path 420.

The first path 410 may be a path for generating a 20 GHz to 29.5 GHz 1-Tone signal. A first high-pass filter HPF1 and a first low-pass filter LPF1 arranged in front of the first path 410 may suppress a harmonic wave generated by the amplifier AMP1 and a spurious wave that falls outside a band of 10 GHz to 15 GHz. In addition, the first high-pass filter HPF1 and the first low-pass filter LPF1 arranged in front of a doubler M1 may remove a spurious wave at a frequency lower than a passband of the first doubler. The doubler M1 may generate a 20 GHz to 29.5 GHz signal by doubling a frequency of a signal received from the first low-pass filter LPF1. The second high-pass filter HPF2 may remove an intermodulation term and a noise component less than 20 GHz generated by the doubler M1. A variable resistor V_ATT1 may be provided to secure high power output (e.g., ~17 dBm) in a band of 20 GHz to 29.5 GHz and have a wide output level adjustment range (e.g., 20 dB). A driver amplifier DR may be for a high gain in a path to obtain a final high power output.

A second switch SW2 may select one of a detailed path 411 that generates a 20 GHz to 24.75 GHz signal and a detailed path 412 that generates a 25 GHz to 29.5 GHz signal. For example, the second switches SW2 may be ~40 GHz single-pole double-throw (SPDT) switches. In the detailed path 411, a second low-pass filter LPF2, a fixed resistor, and a second low-pass filter LPF2 may be arranged in order to output the 20 GHz to 24.75 GHz signal as an LO signal. The second low-pass filter LPF2 may remove a spurious wave that falls outside a band of 20 GHz to 24.75 GHz. In the detailed path 412, a third low-pass filter LP3 may be arranged to output the 25 GHz to 29.5 GHz signal as the LO signal. The third low-pass filter (LPF3) may remove a noise and/or spurious wave that falls outside a band of 25 GHz to 29.5 GHz and may be, for example, a microstrip line-based seventh-order Chebyshev type filter (e.g., an insertion loss of 2.8 dB, 3-dB Cut-off frequency: 34 GHz). A power amplifier PA arranged after the second switches SW2 may be to provide a high power LO output of 20 GHz to 40 GHz+17 dBm.

The second path 420 may be a path for generating a 33.5 GHz to 40 GHz 1-Tone signal. A third high-pass filter HPF3 arranged in front of the second path 420 may suppress a harmonic wave generated by the amplifier AMP1 and a spurious wave less than 15.5 GHz. In addition, the third high-pass filter HPF3 arranged in front of a doubler M2 may remove a spurious wave at a frequency lower than a passband of the doubler M2. The doubler M2 may double a frequency of a signal received from the third high-pass filter HPF3. The fourth high-pass filter HPF4 may remove an intermodulation term and a noise component less than 20 GHz generated by the doubler M2. The fourth high-pass filter HPF4 may be a microstrip line-based ninth-order Chebyshev type filter (e.g., a insertion loss of 3.5 dB, 3-dB Cut-off frequency: 33.5 GHz). A variable resistor V_ATT1 may be to secure high power output (e.g., ~17 dBm) in a band of 33.5 GHz to 40 GHz and have a wide output level adjustment range (e.g., 20 dB).

A third switch SW3 may select one of a detailed path 421 that generates a 33.5 GHz to 36.75 GHz signal and a detailed path 422 that generates a 37 GHz to 40 GHz signal. For example, the third switches SW3 may be the ~40 GHz SPDT switches. In the detailed path 421, a fourth high-pass filter HPF4 may be arranged to output a 33.5 GHz to 36.75 GHz signal as the LO signal. The fourth high-pass filter HPF4 may remove a noise and/or a spurious wave that falls outside a band of 33.5 GHz to 36.75 GHz. In the detailed path 422, a band-pass filter BPF may be arranged. The band-pass filter BPF may remove a noise and/or a spurious wave that falls outside a band of 37 GHz to 40 GHz. Multi-stage amplifiers (e.g., the driver amplifier DR and two power amplifiers PA) arranged in the third switches SW3 may be to provide a high output (+17 dBm) in a supported frequency band.

As such, the LO 400 may utilize a 100 MHz OCXO, a 20 GHz PLL, and 45 GHz doublers M1 and M2 to generate a stable signal source in a mmWave band. The LO 400 may generate the LO signal in one of 20 GHz to 24.75 GHz, 25 GHz to 29.5 GHz, 33.5 GHz to 36.75 GHz, and 37 GHz to 40 GHz bands and provide the LO signal to a passive mixer. In addition, according to another embodiment, the LO signal generated by the LO 400 may be utilized for a shielding test, an insertion loss, and calibration. By utilizing the OCXO in the LO 400, excellent reliability and long-term operational stability may be achieved.

Figure 6:
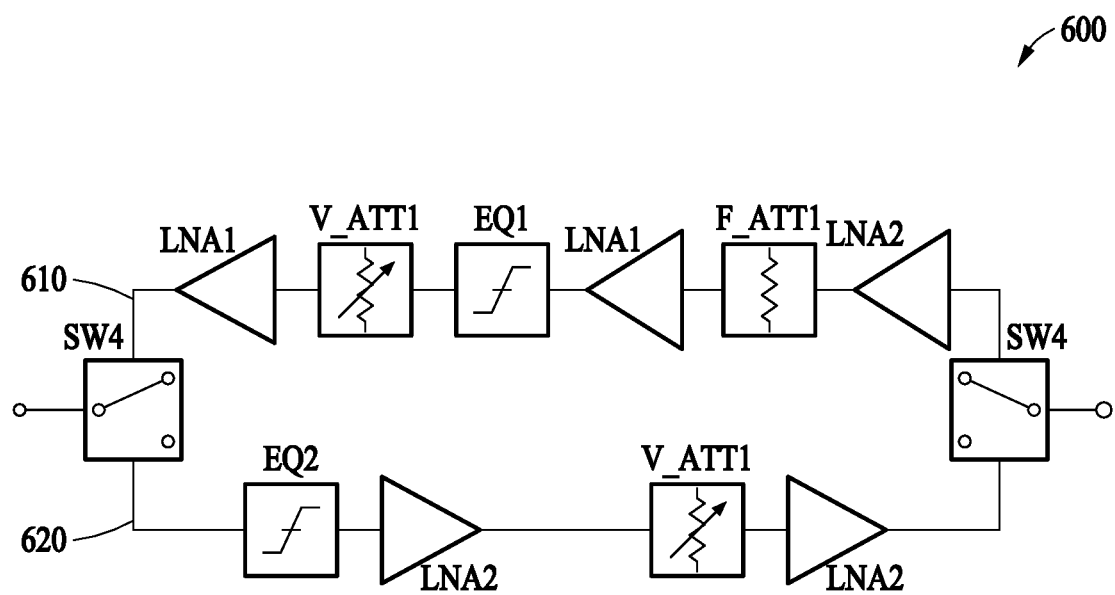
FIG. 6 illustrate a bi-directional amplifier according to an embodiment.

FIG. 6 illustrates a bi-directional amplifier according to an embodiment.

Referring to FIG. 6, a circuit diagram of a bi-directional amplifier 600 is illustrated.

The bi-directional amplifier 600 may include multi-stage amplifiers (e.g., two-stage or three-stage amplifiers) for an up/down-conversion (TX/RX) mode that generates a maximum gain of 20 dB or 30 dB. In order to have a minimal impact on linearity of a wide-band signal, the bi-directional amplifier 600 may use a gain equalizer having a nominal attenuation slope of 5 dB from DC to 6 GHz to lower gain variation within an IF bandwidth (e.g., 1 GHz to 5 GHz) and maintain IF gain flatness of the TX/RX mode to be constant.

A fourth switch SW4 may select one of a downward path 610 and an upward path 620 to control the up/down-conversion mode of the bi-directional amplifier 600.

The downward path 610 may be used to convert an RF signal input to an RF port into an IF signal. In the downward path 610, an amplifier LNA2, a fixed resistor F_ATT1, an amplifier LNA1, a gain equalizer EQ1, a variable resistor V_ATT1, and an amplifier LNA1 may be sequentially arranged. Three-stage amplifiers (e.g., two LNA1s and one LNA2) arranged in the downward path 610 may be, for example, to secure a gain of more than 30 dB and a low noise index of less than 3.5 dB. A gain of a single amplifier LNA1 may be more than 12 dB, an implementation gain of the three-stage amplifiers may be more than 30 dB, and a noise index may be less than 3.17 dB. However, the three amplifiers arranged in the downward path 610 illustrated in FIG. 6 are examples, and the number of amplifiers arranged in the downward path 610 may vary according to a power range that another device (e.g., a measuring instrument) connected to an IF port may receive. The gain equalizer EQ1 may be to secure high gain flatness, for example, final gain flatness may be ±1.3 dB. The variable resistor V_ATT1 may be to secure a gain range and may be arranged in front of the last amplifier LNA1 considering a noise index. For example, an implementation gain adjustment range of the variable resistor V_ATT1 may be 23 dB (step: 1 dB). A maximum IF output through the downward path 610 may be ~11 dBm at 1 dB compression.

The upward path 620 may be used to convert an IF signal input to an IF port into an RF signal. In the upward path 620, a gain equalizer EQ2, an amplifier LNA2, a variable resistor V_ATT1, and an amplifier LNA2 may be sequentially arranged.

The gain equalizer EQ2, for example, may adjust gain flatness to secure linearity of a 5G modulation signal having a bandwidth of 400 MHz or more. For example, final gain flatness of the gain equalizer EQ2 may be ±0.5 dB. Two-stage amplifiers (e.g., two LNA2s) arranged in the upward path 620 may be, for example, to secure a gain of more than 20 dB. A gain of a single amplifier LNA2 may be more than 15.5 dB, and an implementation gain of the two-stage amplifiers may be more than 20 dB. However, as illustrated in FIG. 6, the two amplifiers arranged in the upward path 620 are examples, and a number of amplifiers arranged in the upward path 620 may vary according to a power range that another device (e.g., a measuring instrument) connected to an RF port may receive. The variable resistor V_ATT1 may be for providing an implementation gain adjustment range (e.g., 17 dB (step: 1 dB)).

According to an embodiment, an electronic device may include an IF port that inputs or outputs a signal in a first frequency band, an RF port that inputs or outputs a signal in a second frequency band higher than the signal in the first frequency band, a passive mixer that converts the signal in the first frequency band into the signal in the second frequency band or converts the signal in the second frequency band into the signal in the first frequency band, an LO that generates an LO signal in one of a plurality of frequency bands based on a PLL including a third-order passive filter and provides the LO signal to the passive mixer, and a bi-directional amplifier arranged between the IF port and the passive mixer and including a gain equalizer that controls gain flatness of a signal input to or output from the IF port.

In the electronic device, the bi-directional amplifier may include a downward path that transmits a signal input to the RF port to the IF port, an upward path that transmits a signal input to the IF port to the RF port, and switches that select one of the downward path and the upward path, and in the downward path, an amplifier, a fixed resistor, an amplifier, a gain equalizer, a variable resistor, and an amplifier may be sequentially arranged, and in the upward path, a gain equalizer, an amplifier, a variable resistor, and an amplifier may be sequentially arranged.

The electronic device may further include low-pass filters respectively connected to both ends of the bi-directional amplifier to remove a harmonic component generated by a plurality of amplifiers arranged in the downward path or the upward path, or remove an image component generated by the passive mixer and included in a signal transmitted to the downward path and a leakage component generated by the passive mixer.

The electronic device may further include a high-pass filter arranged between the passive mixer and the RF port to remove a second frequency out-of-band noise component.

In the electronic device, the second frequency out-of-band noise component may include an image component and a leakage component generated by the passive mixer.

In the electronic device, the LO may further include a switch that transmits a signal output from the PLL to a first path or a second path, and in the first path, a first high-pass filter, a fixed resistor, a first low-pass filter, a first doubler, a second high-pass filter, a variable resistor, a driver amplifier, switches for controlling first detailed paths, a driver amplifier, a variable resistor, a power amplifier, and a third low-pass filter may be sequentially arranged in order to output, as the LO signal, a signal in a third frequency band, and in the second path, a third high-pass filter, a second doubler, a fourth high-pass filter, a variable resistor, switches for controlling second detailed paths, a driver amplifier, a fourth high-pass filter, a power amplifier, a variable resistor, and a power amplifier may be sequentially arranged in order to output, as the LO signal, a signal in a fourth frequency band higher than the signal in the third frequency band.

In the electronic device, the first high-pass filter and the first low-pass filter may remove a spurious wave at a frequency lower than a passband of the first doubler, and a second high-pass filter connected to the first doubler may remove an intermodulation term and a noise component generated by the first doubler.

In the electronic device, the third high-pass filter may remove a spurious wave at a frequency lower than a passband of the second doubler, and a fourth high-pass filter connected to the second doubler may be a microstrip line-based Chebyshev filter that removes an intermodulation term and a noise component generated by the second doubler.

In the electronic device, the first detailed paths may include a path in which a second low-pass filter, a fixed resistor, and the second low-pass filter are arranged in order to output, as the LO signal, a signal in a first sub frequency band within the signal in the third frequency band, and a path in which the third low-pass filter is arranged in order to output, as the LO signal, a signal in a second sub frequency band higher than the signal in the first sub frequency band within the signal in the third frequency band.

In the electronic device, the second low-pass filter and the third low-pass filter arranged in the first detailed paths and the third low-pass filter connected to the power amplifier may remove a harmonic wave generated due to a wideband characteristic of the driver amplifier and the power amplifier.

In the electronic device, the second detailed paths may include a path in which the fourth high-pass filter is arranged in order to output, as the LO signal, a signal in a third sub frequency band within the signal in the fourth frequency band, and a path in which a band pass filter is arranged in order to output, as the LO signal, a signal in a fourth sub frequency band higher than the signal in the third sub frequency band within the signal in the fourth frequency band.

In the electronic device, the signal in the third frequency band may be in a band of 20 GHz to 29.5 GHz, and the signal in the fourth frequency band may be in a band of 33.5 GHz to 40 GHz.

In the electronic device, the signal in the first frequency band may be in a band of 1 GHz to 5 GHz, and the signal in the second frequency band may be in a band of 21 GHz to 45 GHz.

The electronic device may be one of a frequency converter, an RF MMIC, a communication terminal, a communication repeater, an RFIC, and a communication measuring instrument.

The LO may include a 20 GHz PLL including a third-order passive filter, and a switch that transmits a signal received from the PLL to one of a plurality of paths, wherein an LO signal in one of a plurality of frequency bands may be generated and output by one of the plurality of paths.

In the oscillator, in a first path of the plurality of paths, a first high-pass filter, a fixed resistor, a first low-pass filter, a first doubler, a second high-pass filter, a variable resistor, a driver amplifier, switches for controlling first detailed paths, a driver amplifier, a variable resistor, a power amplifier, and a third low-pass filter may be sequentially arranged in order to output, as the LO signal, a signal in a first frequency band.

In the LO, the first high-pass filter and the first low-pass filter may remove a spurious wave at a frequency lower than a passband of the first doubler, and a second high-pass filter connected to the first doubler may remove an intermodulation term and a noise component generated by the first doubler.

In the LO, in a second path of the plurality of paths, a third high-pass filter, a second doubler, a fourth high-pass filter, a variable resistor, switches for controlling second detailed paths, a driver amplifier, the fourth high-pass filter, a power amplifier, a variable resistor, and a power amplifier may be sequentially arranged in order to output, as the LO signal, a signal in a second frequency band higher than the signal in the first frequency band.

In the LO, the third high-pass filter may remove a spurious wave at a frequency lower than a passband of the second doubler, and a fourth high-pass filter connected to the second doubler may be a microstrip line-based Chebyshev filter that removes an intermodulation term and a noise component generated by the second doubler.

In the LO, the signal in the first frequency band may be in a band of 20 GHz to 29.5 GHz, and the signal in the second frequency band may be in a band of 33.5 GHz to 40 GHz.

Figure 7:
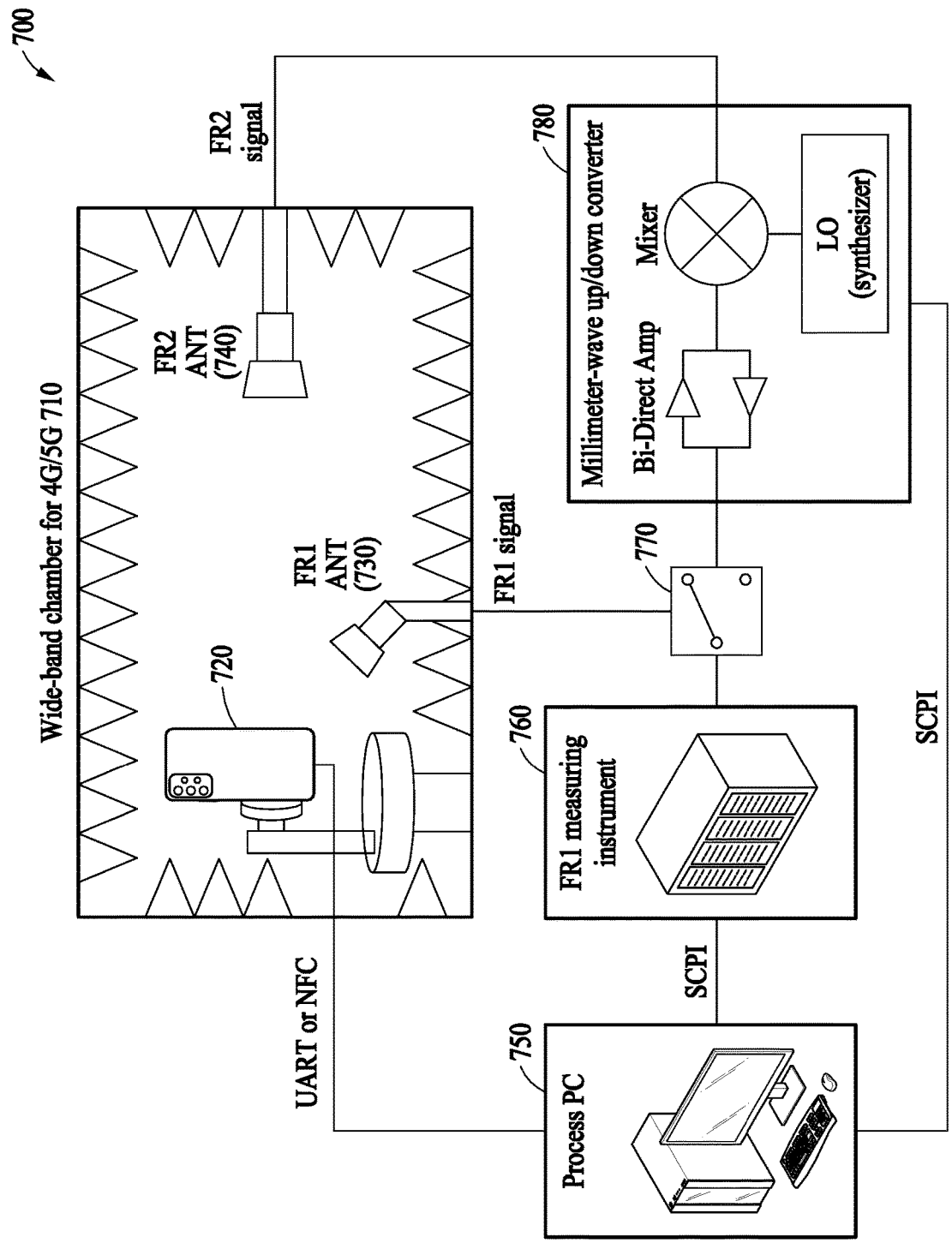
FIG. 7 is a diagram illustrating a manufacturing test using a frequency converter according to an embodiment.

FIG. 7 is a diagram illustrating a manufacturing test using a frequency converter according to an embodiment.

Referring to FIG. 7, a manufacturing test system 700 may include a wide-band chamber 710 for 4G/5G, a process PC 750, an FR1 measuring instrument 760, a switch 770, and a mmWave up/down converter 780 corresponding to the electronic device 101 of FIG. 1, the electronic device 200 of FIG. 2, and the electronic device 300 of FIG. 3, may be included.

A test terminal 720, an FR1 antenna 730, and an FR2 antenna 740 may be arranged inside the wide-band chamber 710. The FR1 antenna 730 may generate an RF1 signal, the FR2 antenna 740 may generate an RF2 signal, and the test terminal 720 may receive and transmit each signal to the process PC 750. The test terminal 720 and the process PC 750 may be connected to each other after wired communication is converted into wireless communication.

Example: Universal Asynchronous Receiver/Transmitter (UART)→Near Field Communication (NFC) or Bluetooth™

A terminal setting command for changing a test mode of the test terminal 720, such as an uplink/downlink operation mode and a 4G, 5G-FR1, 5G-FR2 mode, may be transmitted from the process PC 750 to the test terminal 720.

The process PC 750 may be connected to the FR1 measuring instrument 760 and the mmWave up/down converter 780 through standard commands for programmable instruments (SCPI), and through this connection, a setting command according to a characteristic of a frequency band/modulation signal and an uplink/downlink mode of the FR1 measuring instrument 760 and the mmWave up/down converter 780 may be transmitted from the process PC 750.

An uplink test of the test terminal 720 may be performed in an FR1 band as described below. A signal from the test terminal 720 received by the FR1 antenna 730 arranged in the wide-band chamber 710 may be transmitted to the FR1 measuring instrument 760 through the switch 770, and in the FR1 measuring instrument 760, FR1 uplink performance of the test terminal 720 may be validated.

In addition, a down link test of the test terminal 720 may be performed in the FR1 band as described below. A modulation signal generated by the FR1 measuring instrument 760 may be radiated to the test terminal 720 through the FR1 antenna 730. FR1 downlink performance of the test terminal 720 may be validated based on the signal received by the test terminal 720.

In addition, an uplink test of the test terminal 720 may be performed in an FR2 band as described below. An FR2 signal transmitted from the test terminal 720 may be received by the FR2 antenna 740 to be converted into a signal in the FR1 band in the mmWave up/down converter 780 and may be transmitted to the FR1 measuring instrument 760 through the switch 770. The FR1 measuring instrument 760 may validate FR2 uplink performance of the test terminal 720 based on the transmitted signal.

In addition, a downlink test of the test terminal 720 may be performed in the FR2 band as described below. A modulation signal generated by the FR1 measuring instrument 760 may be transmitted to the mmWave up/down converter 780 through the switch 770 and modulated into an FR2 band signal. The modulated signal may be radiated to the test terminal 720 through the FR2 antenna 740. FR2 downlink performance of the test terminal 720 may be validated by the FR1 measuring instrument 760 based on the signal received by the test terminal 720.

As such, with the implementation of a single system that may validate the RF performance of not only the FR1 band but also the FR2 band, effective validation of the FR2 band may be performed by using existing FR1 band test equipment without expensive FR2 band test equipment.

The embodiments of the present disclosure disclosed in the specification and the drawings are merely presented to easily describe technical contents of various embodiments of the present disclosure and help the understanding of them and are not intended to limit the various embodiments. Therefore, all changes or modifications derived from the technical idea of the various embodiments of the present disclosure as well as the various embodiments disclosed herein should be construed to fall within the various embodiments.

What is claimed is:

1. An electronic device, comprising:
   an intermediate frequency (IF) port configured to input or output a signal in a first frequency band;
   a radio frequency (RF) port configured to input or output a signal in a second frequency band higher than the signal in the first frequency band;
   a passive mixer configured to convert the signal in the first frequency band into the signal in the second frequency band or convert the signal in the second frequency band into the signal in the first frequency band;
   a local oscillator (LO) configured to generate an LO signal in one of a plurality of frequency bands based on a phase locked loop (PLL) comprising a third-order passive filter and provide the LO signal to the passive mixer; and
   a bi-directional amplifier arranged between the IF port and the passive mixer and comprising a gain equalizer configured to control gain flatness of a signal input to or output from the IF port.

2. The electronic device of claim 1, wherein the bi-directional amplifier comprises:
   a downward path configured to transmit the signal input to the RF port to the IF port;
   an upward path configured to transmit the signal input to the IF port to the RF port; and
   switches configured to select one of the downward path and the upward path,
   wherein, in the downward path, a first amplifier, a fixed resistor, a second amplifier, a first gain equalizer, a first variable resistor, and a third amplifier are sequentially arranged, and
   wherein, in the upward path, a second gain equalizer, a fourth amplifier, a second variable resistor, and a fifth amplifier are sequentially arranged.

3. The electronic device of claim 1, further comprising:
   low-pass filters respectively connected to each end of the bi-directional amplifier and configured to remove a harmonic component generated by a plurality of amplifiers arranged in a downward path or an upward path, or remove an image component generated by the passive mixer and comprised in a signal transmitted to the downward path and a leakage component generated by the passive mixer.

4. The electronic device of claim 1, further comprising a high-pass filter arranged between the passive mixer and the RF port and configured to remove a second frequency out-of-band noise component.

5. The electronic device of claim 4, wherein the second frequency out-of-band noise component comprises an image component and a leakage component generated by the passive mixer.

6. The electronic device of claim 1, wherein the LO further comprises a switch configured to transmit a signal output from the PLL to a first path or a second path,
   wherein, in the first path, a first high-pass filter, a first fixed resistor, a first low-pass filter, a first doubler, a second high-pass filter, a first variable resistor, a first driver amplifier, switches for controlling first detailed paths, a second driver amplifier, a second variable resistor, a first power amplifier, and a third low-pass filter are sequentially arranged in order to output, as the LO signal, a signal in a third frequency band, and
   wherein, in the second path, a third high-pass filter, a second doubler, a fourth high-pass filter, a third variable resistor, switches for controlling second detailed paths, a third driver amplifier, a fourth high-pass filter, a second power amplifier, a fourth variable resistor, and a third power amplifier are sequentially arranged in order to output, as the LO signal, a signal in a fourth frequency band higher than the signal in the third frequency band.

7. The electronic device of claim 6, wherein the first high-pass filter and the first low-pass filter are configured to remove a spurious wave at a frequency lower than a passband of the first doubler, and
   wherein a second high-pass filter connected to the first doubler is configured to remove an intermodulation term and a noise component generated by the first doubler.

8. The electronic device of claim 6, wherein the third high-pass filter is configured to remove a spurious wave at a frequency lower than a passband of the second doubler, and
   wherein a fourth high-pass filter connected to the second doubler is a microstrip line-based Chebyshev filter configured to remove an intermodulation term and a noise component generated by the second doubler.

9. The electronic device of claim 6, wherein the first detailed paths comprise:
   a path in which a second low-pass filter, a second fixed resistor, and the second low-pass filter are arranged in order to output, as the LO signal, a signal in a first sub frequency band within the signal in the third frequency band; and
   a path in which the third low-pass filter is arranged in order to output, as the LO signal, a signal in a second sub frequency band higher than the signal in the first sub frequency band within the signal in the third frequency band.

10. The electronic device of claim 9, wherein the second low-pass filter and the third low-pass filter arranged in the first detailed paths, the third low-pass filter being connected to the first power amplifier, are configured to remove a harmonic wave generated due to a wideband characteristic of the second driver amplifier and the first power amplifier.

11. The electronic device of claim 6, wherein the second detailed paths comprise:
   a path in which the fourth high-pass filter is arranged in order to output, as the LO signal, a signal in a third sub frequency band within the signal in the fourth frequency band; and
   a path in which a band pass filter is arranged in order to output, as the LO signal, a signal in a fourth sub frequency band higher than the signal in the third sub frequency band within the signal in the fourth frequency band.

12. The electronic device of claim 6, wherein the signal in the third frequency band is in a band of 20 gigahertz (GHz) to 29.5 GHz, and
   wherein the signal in the fourth frequency band is in a band of 33.5 GHz to 40 GHz.

13. The electronic device of claim 1, wherein the signal in the first frequency band is in a band of 1 GHz to 5 GHz, and
   wherein the signal in the second frequency band is in a band of 21 GHz to 45 GHz.

14. The electronic device of claim 1, wherein the electronic device is one of a frequency converter, an RF millimeter integrated circuit (MMIC), a communication terminal, a communication repeater, an RF integrated circuit (RFIC), and a communication measuring instrument.

* * * * *